United States Patent
Mahajani

(10) Patent No.: US 7,972,978 B2
(45) Date of Patent: *Jul. 5, 2011

(54) PRETREATMENT PROCESSES WITHIN A BATCH ALD REACTOR

(75) Inventor: Maitreyee Mahajani, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 388 days.

This patent is subject to a terminal disclaimer.

(21) Appl. No.: 12/163,876

(22) Filed: Jun. 27, 2008

(65) Prior Publication Data

US 2008/0261413 A1    Oct. 23, 2008

Related U.S. Application Data

(63) Continuation of application No. 11/213,161, filed on Aug. 26, 2005, now Pat. No. 7,402,534.

(51) Int. Cl.
    *H01L 21/31* (2006.01)
    *H01L 21/469* (2006.01)

(52) U.S. Cl. .... 438/785; 438/758; 438/778; 257/E21.24

(58) Field of Classification Search .................. 438/785, 438/758, 778; 257/E21.24
    See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,415,275 A | 11/1983 | Dietrich | |
| 4,693,208 A | 9/1987 | Sakai | |
| 4,745,088 A | 5/1988 | Inoue et al. | |
| 4,761,269 A | 8/1988 | Conger et al. | |
| 4,834,831 A | 5/1989 | Nishizawa et al. | |
| 4,975,252 A | 12/1990 | Nishizawa et al. | |
| 4,993,357 A | 2/1991 | Scholz | |
| 5,027,746 A | 7/1991 | Frijlink et al. | |
| 5,173,327 A | 12/1992 | Sandhu et al. | |

(Continued)

FOREIGN PATENT DOCUMENTS

EP    0 464 515    6/1991

(Continued)

OTHER PUBLICATIONS

Agarwal, et al. "Challenges in Integrating the High-K Gate Dielectric Film to the Conventional CMOS Process Flow," Mat. Sec. Soc. Sump. Proc. vol. 670 (2001).

(Continued)

*Primary Examiner* — Angel Roman
(74) *Attorney, Agent, or Firm* — Patterson & Sheridan, LLP

(57) ABSTRACT

Embodiments of the invention provide methods for forming a hafnium material on a substrate within a processing chamber. In one embodiment, a method is provided which includes exposing the substrate within the processing chamber to a first oxidizing gas during a pretreatment process, exposing the substrate sequentially to a second oxidizing gas and a deposition gas during an atomic layer deposition (ALD) cycle, wherein the second oxidizing gas contains water and the deposition gas contains a hafnium amino compound, and repeating the ALD cycle to form a hafnium-containing layer having a thickness within a range from about 5 Å to about 300 Å. In one example, the first oxidizing gas contains an $O_3/O_2$ mixture having an ozone concentration within a range from about 5 atomic percent to about 30 atomic percent.

25 Claims, 1 Drawing Sheet

U.S. PATENT DOCUMENTS

| | | |
|---|---|---|
| 5,178,681 A | 1/1993 | Moore et al. |
| 5,225,366 A | 7/1993 | Yoder |
| 5,261,959 A | 11/1993 | Gasworth |
| 5,281,274 A | 1/1994 | Yoder |
| 5,290,609 A | 3/1994 | Horike et al. |
| 5,294,286 A | 3/1994 | Nishizawa et al. |
| 5,310,339 A | 5/1994 | Ushikawa |
| 5,338,362 A | 8/1994 | Imahashi |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,674,786 A | 10/1997 | Turner et al. |
| 5,711,811 A | 1/1998 | Suntola et al. |
| 5,730,802 A | 3/1998 | Ishizumi et al. |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,879,459 A | 3/1999 | Gadgli et al. |
| 5,916,365 A | 6/1999 | Sherman |
| 5,972,430 A | 10/1999 | DiMeo, Jr. et al. |
| 5,976,261 A | 11/1999 | Moslehi et al. |
| 6,013,553 A | 1/2000 | Wallace et al. |
| 6,015,590 A | 1/2000 | Suntola et al. |
| 6,020,243 A | 2/2000 | Wallace et al. |
| 6,042,652 A | 3/2000 | Hyun et al. |
| 6,060,755 A | 5/2000 | Ma et al. |
| 6,071,572 A | 6/2000 | Mosely et al. |
| 6,139,700 A | 10/2000 | Kang et al. |
| 6,167,837 B1 | 1/2001 | Cook |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,487 B1 | 3/2001 | Kim et al. |
| 6,231,672 B1 | 5/2001 | Choi et al. |
| 6,238,734 B1 | 5/2001 | Senzaki et al. |
| 6,270,572 B1 | 8/2001 | Kim et al. |
| 6,287,635 B1 | 9/2001 | Cook et al. |
| 6,287,965 B1 | 9/2001 | Kang et al. |
| 6,291,283 B1 | 9/2001 | Wilk |
| 6,291,876 B1 | 9/2001 | Stumborg et al. |
| 6,297,172 B1 | 10/2001 | Kashiwagi |
| 6,297,539 B1 | 10/2001 | Ma et al. |
| 6,299,294 B1 | 10/2001 | Regan |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,321,680 B2 | 11/2001 | Cook et al. |
| 6,348,386 B1 | 2/2002 | Gilmer |
| 6,352,593 B1 | 3/2002 | Brors et al. |
| 6,352,594 B2 | 3/2002 | Cook et al. |
| 6,372,598 B2 | 4/2002 | Kang et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,416,577 B1 | 7/2002 | Suntoloa et al. |
| 6,420,279 B1 | 7/2002 | Ono et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,452,229 B1 | 9/2002 | Krivokapic |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,506,691 B2 | 1/2003 | Cook et al. |
| 6,511,539 B1 | 1/2003 | Raaijmakers |
| 6,551,406 B2 | 4/2003 | Kilpi |
| 6,572,705 B1 | 6/2003 | Suntola et al. |
| 6,578,287 B2 | 6/2003 | Aswad |
| 6,579,372 B2 | 6/2003 | Park |
| 6,593,484 B2 | 7/2003 | Yasuhara et al. |
| 6,599,572 B2 | 7/2003 | Saanila et al. |
| 6,607,973 B1 | 8/2003 | Jeon |
| 6,620,723 B1 | 9/2003 | Byun et al. |
| 6,630,030 B1 | 10/2003 | Suntola et al. |
| 6,630,201 B2 | 10/2003 | Chiang et al. |
| 6,632,747 B2 | 10/2003 | Niimi et al. |
| 6,647,138 B1 | 11/2003 | Sakaguchi |
| 6,660,126 B2 | 12/2003 | Nguyen et al. |
| 6,660,659 B1 | 12/2003 | Kraus et al. |
| 6,713,846 B1 | 3/2004 | Senzaki |
| 6,716,287 B1 | 4/2004 | Santiago et al. |
| 6,718,126 B2 | 4/2004 | Lei |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,780,464 B2 | 8/2004 | Cook et al. |
| 6,803,272 B1 | 10/2004 | Halliyal et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,831,004 B2 | 12/2004 | Byun et al. |
| 6,831,021 B2 | 12/2004 | Chua et al. |
| 6,846,516 B2 | 1/2005 | Yang et al. |
| 6,858,547 B2 | 2/2005 | Metzner et al. |
| 6,861,356 B2 | 3/2005 | Matsuse et al. |
| 6,866,746 B2 | 3/2005 | Lei et al. |
| 6,868,859 B2 | 3/2005 | Yudovsky |
| 6,881,437 B2 | 4/2005 | Ivanov et al. |
| 6,897,106 B2 | 5/2005 | Park et al. |
| 6,902,624 B2 | 6/2005 | Seidel et al. |
| 6,921,062 B2 | 7/2005 | Gregg et al. |
| 6,924,191 B2 | 8/2005 | Liu et al. |
| 6,930,060 B2 | 8/2005 | Chou et al. |
| 6,969,539 B2 | 11/2005 | Gordon et al. |
| 7,005,697 B2 | 2/2006 | Batra et al. |
| 7,067,439 B2 | 6/2006 | Metzner et al. |
| 7,208,413 B2 | 4/2007 | Byun et al. |
| 7,402,534 B2 | 7/2008 | Mahajani |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0021589 A1 | 9/2001 | Wilk |
| 2001/0024387 A1 | 9/2001 | Raaijmakers et al. |
| 2001/0029092 A1 | 10/2001 | Park et al. |
| 2001/0029891 A1 | 10/2001 | Oh et al. |
| 2001/0042523 A1 | 11/2001 | Kesala |
| 2001/0042799 A1 | 11/2001 | Kim et al. |
| 2001/0054377 A1 | 12/2001 | Lindfors et al. |
| 2002/0000196 A1 | 1/2002 | Park |
| 2002/0000598 A1 | 1/2002 | Kang et al. |
| 2002/0005556 A1 | 1/2002 | Cartier et al. |
| 2002/0007790 A1 | 1/2002 | Park |
| 2002/0008297 A1 | 1/2002 | Park et al. |
| 2002/0009544 A1 | 1/2002 | McFeely et al. |
| 2002/0009896 A1 | 1/2002 | Sandhu et al. |
| 2002/0014647 A1 | 2/2002 | Seidl et al. |
| 2002/0015790 A1 | 2/2002 | Baum et al. |
| 2002/0017242 A1 | 2/2002 | Hamaguchi et al. |
| 2002/0029092 A1 | 3/2002 | Gass |
| 2002/0041931 A1 | 4/2002 | Suntola et al. |
| 2002/0043666 A1 | 4/2002 | Parsons et al. |
| 2002/0052097 A1 | 5/2002 | Park |
| 2002/0064970 A1 | 5/2002 | Chooi et al. |
| 2002/0066411 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081826 A1 | 6/2002 | Rotondaro et al. |

| | | | | | |
|---|---|---|---|---|---|
| 2002/0081844 A1 | 6/2002 | Jeon et al. | 2003/0186515 A1 | 10/2003 | Dean et al. |
| 2002/0086106 A1 | 7/2002 | Park et al. | 2003/0188682 A1 | 10/2003 | Tois et al. |
| 2002/0086111 A1 | 7/2002 | Byun et al. | 2003/0198754 A1 | 10/2003 | Xi et al. |
| 2002/0092471 A1 | 7/2002 | Kang et al. | 2003/0205729 A1 | 11/2003 | Basceri et al. |
| 2002/0093046 A1 | 7/2002 | Moriya et al. | 2003/0213560 A1 | 11/2003 | Wang et al. |
| 2002/0093781 A1 | 7/2002 | Bachhofer et al. | 2003/0213987 A1 | 11/2003 | Basceri et al. |
| 2002/0094689 A1 | 7/2002 | Park | 2003/0216981 A1 | 11/2003 | Tillman |
| 2002/0098627 A1 | 7/2002 | Pomarede et al. | 2003/0219942 A1 | 11/2003 | Choi et al. |
| 2002/0104481 A1 | 8/2002 | Chiang et al. | 2003/0221780 A1 | 12/2003 | Lei et al. |
| 2002/0106536 A1 | 8/2002 | Lee et al. | 2003/0224107 A1 | 12/2003 | Lindfors et al. |
| 2002/0108570 A1 | 8/2002 | Lindfors et al. | 2003/0227033 A1 | 12/2003 | Ahn et al. |
| 2002/0110991 A1 | 8/2002 | Li | 2003/0232501 A1 | 12/2003 | Kher et al. |
| 2002/0115886 A1 | 8/2002 | Yasuhara et al. | 2003/0232506 A1 | 12/2003 | Metzner et al. |
| 2002/0121241 A1 | 9/2002 | Nguyen et al. | 2003/0232511 A1 | 12/2003 | Metzner et al. |
| 2002/0121342 A1 | 9/2002 | Lu et al. | 2003/0232513 A1 | 12/2003 | Kraus et al. |
| 2002/0127745 A1 | 9/2002 | Lu et al. | 2003/0234417 A1 | 12/2003 | Raaijmakers et al. |
| 2002/0134307 A1 | 9/2002 | Choi | 2003/0235961 A1 | 12/2003 | Metzner et al. |
| 2002/0144655 A1 | 10/2002 | Chiang et al. | 2004/0005749 A1 | 1/2004 | Choi et al. |
| 2002/0144657 A1 | 10/2002 | Chiang et al. | 2004/0007747 A1 | 1/2004 | Visokay et al. |
| 2002/0146511 A1 | 10/2002 | Chiang et al. | 2004/0009307 A1 | 1/2004 | Koh et al. |
| 2002/0146895 A1 | 10/2002 | Ramdani et al. | 2004/0009675 A1 | 1/2004 | Eissa et al. |
| 2002/0151152 A1 | 10/2002 | Shimamoto et al. | 2004/0011404 A1 | 1/2004 | Ku et al. |
| 2002/0153579 A1 | 10/2002 | Yamamoto | 2004/0011504 A1 | 1/2004 | Ku et al. |
| 2002/0155722 A1 | 10/2002 | Satta et al. | 2004/0013577 A1 | 1/2004 | Ganguli et al. |
| 2002/0162506 A1 | 11/2002 | Sneh et al. | 2004/0014320 A1 | 1/2004 | Chen et al. |
| 2002/0172768 A1 | 11/2002 | Endo et al. | 2004/0015300 A1 | 1/2004 | Ganguli et al. |
| 2002/0175393 A1 | 11/2002 | Baum et al. | 2004/0016404 A1 | 1/2004 | Gregg et al. |
| 2002/0177282 A1 | 11/2002 | Song | 2004/0016973 A1 | 1/2004 | Rotondaro et al. |
| 2002/0180028 A1 | 12/2002 | Borovik et al. | 2004/0018723 A1 | 1/2004 | Byun et al. |
| 2002/0182320 A1 | 12/2002 | Leskela et al. | 2004/0018747 A1 | 1/2004 | Lee et al. |
| 2002/0187256 A1 | 12/2002 | Elers et al. | 2004/0023461 A1 | 2/2004 | Ahn et al. |
| 2002/0195643 A1 | 12/2002 | Harada | 2004/0023462 A1 | 2/2004 | Rotondaro et al. |
| 2002/0197856 A1 | 12/2002 | Matsuse et al. | 2004/0025370 A1 | 2/2004 | Guenther et al. |
| 2002/0197881 A1 | 12/2002 | Ramdani et al. | 2004/0028952 A1 | 2/2004 | Cartier et al. |
| 2002/0197883 A1 | 12/2002 | Niimi et al. | 2004/0029321 A1 | 2/2004 | Ang et al. |
| 2003/0004723 A1 | 1/2003 | Chihara | 2004/0033698 A1 | 2/2004 | Lee et al. |
| 2003/0010451 A1 | 1/2003 | Tzu et al. | 2004/0036111 A1 | 2/2004 | Nishikawa et al. |
| 2003/0017697 A1 | 1/2003 | Choi et al. | 2004/0038486 A1 | 2/2004 | Chua et al. |
| 2003/0022338 A1 | 1/2003 | Ruben et al. | 2004/0038554 A1 | 2/2004 | Ahn et al. |
| 2003/0031807 A1 | 2/2003 | Elers et al. | 2004/0040501 A1 | 3/2004 | Vaartstra |
| 2003/0042630 A1 | 3/2003 | Babcoke et al. | 2004/0043149 A1 | 3/2004 | Gordon et al. |
| 2003/0049372 A1 | 3/2003 | Cook et al. | 2004/0043569 A1 | 3/2004 | Ahn et al. |
| 2003/0049931 A1 | 3/2003 | Byun et al. | 2004/0043623 A1 | 3/2004 | Liu et al. |
| 2003/0049942 A1 | 3/2003 | Haukka et al. | 2004/0043630 A1 | 3/2004 | Vaartstra et al. |
| 2003/0053799 A1 | 3/2003 | Lei et al. | 2004/0046197 A1 | 3/2004 | Basceri et al. |
| 2003/0057527 A1 | 3/2003 | Chung et al. | 2004/0048491 A1 | 3/2004 | Jung et al. |
| 2003/0068437 A1 | 4/2003 | Nakamura et al. | 2004/0051152 A1 | 3/2004 | Nakajima |
| 2003/0072913 A1 | 4/2003 | Chou et al. | 2004/0053484 A1 | 3/2004 | Kumar et al. |
| 2003/0072975 A1 | 4/2003 | Shero et al. | 2004/0065255 A1 | 4/2004 | Yang et al. |
| 2003/0075273 A1 | 4/2003 | Kilpela et al. | 2004/0069227 A1 | 4/2004 | Ku et al. |
| 2003/0075925 A1 | 4/2003 | Lindfors et al. | 2004/0071897 A1 | 4/2004 | Verplancken et al. |
| 2003/0079686 A1 | 5/2003 | Chen et al. | 2004/0077182 A1 | 4/2004 | Lim et al. |
| 2003/0082296 A1 | 5/2003 | Elers et al. | 2004/0099219 A1 | 5/2004 | Park et al. |
| 2003/0082301 A1 | 5/2003 | Chen et al. | 2004/0144308 A1 | 7/2004 | Yudovsky |
| 2003/0089308 A1 | 5/2003 | Raaijmakers | 2004/0144311 A1 | 7/2004 | Chen et al. |
| 2003/0089942 A1 | 5/2003 | Bhattacharyya | 2004/0157391 A1 | 8/2004 | Park et al. |
| 2003/0096473 A1 | 5/2003 | Shih et al. | 2004/0198069 A1 | 10/2004 | Metzner et al. |
| 2003/0101927 A1 | 6/2003 | Raaijmakers | 2004/0203254 A1 | 10/2004 | Conley, Jr. et al. |
| 2003/0101938 A1 | 6/2003 | Ronsse et al. | 2004/0214354 A1 | 10/2004 | Marsh et al. |
| 2003/0104710 A1 | 6/2003 | Visokay et al. | 2004/0216670 A1 | 11/2004 | Gutsche et al. |
| 2003/0106490 A1 | 6/2003 | Jallepally et al. | 2004/0219784 A1 | 11/2004 | Kang et al. |
| 2003/0109114 A1 | 6/2003 | Niwa | 2004/0224506 A1 | 11/2004 | Choi et al. |
| 2003/0113187 A1 | 6/2003 | Lei et al. | 2004/0235285 A1 | 11/2004 | Kang et al. |
| 2003/0116087 A1 | 6/2003 | Nguyen et al. | 2004/0256664 A1 | 12/2004 | Chou et al. |
| 2003/0116804 A1 | 6/2003 | Visokay et al. | 2005/0006799 A1 | 1/2005 | Gregg et al. |
| 2003/0121469 A1 | 7/2003 | Lindfors et al. | 2005/0008779 A1 | 1/2005 | Vang et al. |
| 2003/0121608 A1 | 7/2003 | Chen et al. | 2005/0009371 A1 | 1/2005 | Metzner et al. |
| 2003/0133861 A1 | 7/2003 | Bowen et al. | 2005/0059240 A1 | 3/2005 | Choi et al. |
| 2003/0134038 A1 | 7/2003 | Paranjpe | 2005/0064207 A1 | 3/2005 | Senzaki et al. |
| 2003/0140854 A1 | 7/2003 | Kilpi | 2005/0070126 A1 | 3/2005 | Senzaki |
| 2003/0143328 A1 | 7/2003 | Chen et al. | 2005/0095859 A1 | 5/2005 | Chen et al. |
| 2003/0143747 A1 | 7/2003 | Bondestam et al. | 2005/0104142 A1 | 5/2005 | Narayanan et al. |
| 2003/0153177 A1 | 8/2003 | Tepman et al. | 2005/0118804 A1 | 6/2005 | Byun et al. |
| 2003/0160277 A1 | 8/2003 | Bhattacharyya | 2005/0124109 A1 | 6/2005 | Quevedo-Lopez et al. |
| 2003/0168750 A1 | 9/2003 | Basceri et al. | 2005/0130438 A1 | 6/2005 | Rotondaro |
| 2003/0172872 A1 | 9/2003 | Thakur et al. | 2005/0130442 A1 | 6/2005 | Visokay et al. |
| 2003/0173586 A1 | 9/2003 | Moriwaki et al. | 2005/0153571 A1 | 7/2005 | Senzaki |
| 2003/0185980 A1 | 10/2003 | Endo | 2005/0170667 A1* | 8/2005 | Conley et al. .......... 438/785 |
| 2003/0186495 A1 | 10/2003 | Saanila et al. | 2005/0188923 A1 | 9/2005 | Cook et al. |

| | | | |
|---|---|---|---|
| 2005/0233156 A1 | 10/2005 | Senzaki et al. | |
| 2005/0252449 A1 | 11/2005 | Nguyen et al. | |
| 2005/0255243 A1 | 11/2005 | Senzaki | |
| 2005/0260347 A1 | 11/2005 | Narwankar et al. | |
| 2005/0260357 A1 | 11/2005 | Olsen et al. | |
| 2005/0271812 A1 | 12/2005 | Myo et al. | |
| 2005/0271813 A1 | 12/2005 | Kher et al. | |
| 2006/0019033 A1 | 1/2006 | Muthukrishnan et al. | |
| 2006/0062917 A1 | 3/2006 | Muthukrishnan et al. | |
| 2006/0153995 A1 | 7/2006 | Narwankar et al. | |
| 2006/0156979 A1 | 7/2006 | Thakur et al. | |
| 2006/0189154 A1* | 8/2006 | Ahn et al. | 438/763 |
| 2006/0208215 A1 | 9/2006 | Metzner et al. | |
| 2006/0223339 A1 | 10/2006 | Metzner et al. | |
| 2006/0264067 A1 | 11/2006 | Kher et al. | |
| 2007/0003698 A1 | 1/2007 | Chen et al. | |
| 2007/0020890 A1 | 1/2007 | Thakur et al. | |
| 2007/0026147 A1 | 2/2007 | Chen et al. | |
| 2007/0049043 A1 | 3/2007 | Muthukrishnan et al. | |
| 2007/0049053 A1 | 3/2007 | Mahajani | |
| 2007/0059945 A1 | 3/2007 | Mohklesi | |
| 2007/0059948 A1 | 3/2007 | Metzner et al. | |
| 2007/0065578 A1 | 3/2007 | McDougall | |

FOREIGN PATENT DOCUMENTS

| | | |
|---|---|---|
| EP | 0 497 267 | 8/1992 |
| EP | 0 973 189 | 7/1999 |
| EP | 0 973 191 | 1/2000 |
| EP | 1 170 804 | 6/2001 |
| EP | 1 146 141 | 10/2001 |
| EP | 1 167 569 | 1/2002 |
| EP | 1 321 973 | 12/2002 |
| GB | 2 355 727 | 5/2001 |
| JP | 58-098917 | 6/1983 |
| JP | 04-291916 | 10/1992 |
| JP | 05-047666 | 2/1993 |
| JP | 05-206036 | 8/1993 |
| JP | 05-234899 | 9/1993 |
| JP | 05-270997 | 10/1993 |
| JP | 06-224138 | 8/1994 |
| JP | 2000-212752 | 8/2000 |
| JP | 2000-319772 | 11/2000 |
| JP | 2001-020075 | 1/2001 |
| JP | 2001-111000 | 4/2001 |
| JP | 02-060944 | 2/2002 |
| JP | 02-069641 | 3/2002 |
| JP | 02-093804 | 3/2002 |
| JP | 02-167672 | 6/2002 |
| JP | 02-172767 | 6/2002 |
| WO | WO 96/17107 | 6/1996 |
| WO | WO 99/01595 | 1/1999 |
| WO | WO 99/29924 | 6/1999 |
| WO | WO 99/65064 | 12/1999 |
| WO | WO 00/13235 | 3/2000 |
| WO | WO 00/54320 | 9/2000 |
| WO | WO 00/70674 | 11/2000 |
| WO | WO 00/79576 | 12/2000 |
| WO | WO 01/15220 | 3/2001 |
| WO | WO 01/17692 | 3/2001 |
| WO | WO 01/25502 | 4/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/40541 | 6/2001 |
| WO | WO 01/66832 | 9/2001 |
| WO | WO 01/82390 | 11/2001 |
| WO | WO 01/99166 | 12/2001 |
| WO | WO 02/01628 | 1/2002 |
| WO | WO 02/08488 | 1/2002 |
| WO | WO 02/09167 | 1/2002 |
| WO | WO 02/27063 | 4/2002 |
| WO | WO 02/43115 | 5/2002 |
| WO | WO 02/45167 | 6/2002 |
| WO | WO 02/45871 | 6/2002 |
| WO | WO 03/023835 | 3/2003 |
| WO | WO 2004/010471 | 1/2004 |
| WO | WO 2005/117086 | 12/2005 |

OTHER PUBLICATIONS

Balog, et al. "Chemical Vapor Deposition and Characterization of $HfO_2$ Films from Organo-Hafnium Compounds," Thin Solid Films, 41 (1977) 247-259.

Chatham, Hood; et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorg. Chem. 1999, 38, 2238-2239.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, J.F.; et al. "Interval Annealing During Alternating Pulse Deposition", Mat. Res. Soc. Symp. Proc. vol. 811, Apr. 12-16, 2004, D1.3.1.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606.

George, et al. "Surface Chemistry for Atomic Layer Growth," J. Phys. Chem. (1996), 100, 13121-13131.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

He, et al. "Pulsed Deposition of Silicate Films," Journal of Applied Physics, vol. 94, No. 5, Sep. 1, 2003, pp. 3657-3659.

Hendrix, et al. "Composition control of $Hf_{1-x}Si_xO_2$ films deposited on Si by chemical-vapor deposition using amide precursors," Applied Physics Letters, American Institute of Physics. New York, US, vol. 80, No. 13, Apr. 1, 2002, pp. 2362-2364.

Ho, et al. "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.

Hwang, et al. "Nanometer-Size α-$PbO_2$-type $TiO_2$ in Garnet: A Thermobarometer for Ultrahigh-Pressure Metamorphism," Science Vo. 288 (Apr. 14, 2000).

International Search Report and the Written Opinion for International Application No. PCT/US2006/022997 dated Nov. 9, 2006.

International Search Report and the Written Opinion for International Application No. PCT/US2006/032408 dated Sep. 25, 2007.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kang, et al. "Infrared Spectroscopic Study of Atomic Layer Deposition Mechanism for Hafnium Silicate Thin Films Using $HfCl_2$ [$N(SiMe_3)_2$]$_2$ and $H_2O$," J. Vac. Sci. Technol. A 22(6), Nov./Dec. 2004, American Vacuum Society, pp. 2393-2397.

Kattelus, et al. "Electrical Properties of Tantalum Based Composite Oxide Films," Mat. Res. Soc. Symp. Proc., 284 (1993) 511-516.

Kawahara, et al. "Effects of Hf sources, oxidizing agents, and $NH_3$ radicals on properties of $HfAlO_x$ films prepared by atomic layer deposition", IWGI 2003, Tokyo, Nov. 6, 2003, pp. 32-37.

Kukli, et al. "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Niinisto, et al. "Synthesis of Oxide Thin Films and Overlayers by Atomic Layer Epitaxy for Advanced Applications," Materials Science and Engineering B41 (1996) 23-29.

Ohshita, et al. "Hf$_{1-x}$Si$_x$O$_2$ deposition by metal organic chemical vapor deposition using the Hf(NEt$_2$)$_4$/SiH(NEt$_2$)$_3$/O$_2$ gas system", Preparation and Characterization, Elsevier Sequioa, NL, vol. 416, No. 1-2, Sep. 2, 2002, pp. 208-211.

Ohshita, et al. "HfO$_2$ Growth by Low-pressure Chemical Vapor Deposition Using the Hf(N(C$_2$H$_5$)$_2$)$_4$/O$_2$ Gas System," Journal of Crystal Growth 233 (2001) 292-297.

Ritala, et al. Ann. Acad. Sci. Fenn. Ser. A II. Chemica 257 (1994) 1-48.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films", Electrochemical Society Proceedings vol. 2004-01, pp. 264-270.

Visokay, et al. "Application of HfSiON as a gate dielectric material", Applied Physics Letter, American Institute of Physics, New York, US, vol. 80, No. 17, Apr. 29, 2002, pp. 3183-3185.

* cited by examiner

US 7,972,978 B2

PRETREATMENT PROCESSES WITHIN A BATCH ALD REACTOR

CROSS-REFERENCE TO RELATED APPLICATIONS

This application is a continuation of U.S. Ser. No. 11/213,161, filed Aug. 26, 2005, and issued as U.S. Pat. No. 7,402,534, which is herein incorporated by reference in its entirety.

BACKGROUND OF THE INVENTION

1. Field of the Invention

Embodiments of the invention generally relate to fabrication processes, and more specifically, for treatment processes and deposition processes while forming a material on a substrate.

2. Description of the Related Art

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive. Feature sizes of about 45 nm or smaller and aspect ratios of 10, 20, 30 or greater are more frequently desired during fabrication processes. While conventional chemical vapor deposition (CVD) processes have proved successful, aggressive device geometries require an alternative deposition technique, such as atomic layer deposition (ALD). During an ALD process, chemical precursors or reactant gases are sequentially introduced into a process chamber containing a substrate. Generally, a first precursor gas is administered into the process chamber and is adsorbed onto the substrate surface. A second precursor gas is administered into the process chamber and reacts with the first precursor to form a deposited material. A purge step is typically carried out between the delivery of each precursor gas and may be a continuous purge with a carrier gas or a pulse purge between the delivery of the precursor gases.

Atomic layer deposition processes have been successfully implemented for depositing dielectric layers, barrier layers and conductive layers. Dielectric materials deposited by ALD processes for gate and capacitor applications include hafnium oxide, hafnium silicate, zirconium oxide and tantalum oxide. Generally, an ALD process provides a deposited material with lower impurities and better conformality and control of film thickness when compared to a CVD process. However, an ALD process usually has a slower deposition rate than a comparable CVD process for depositing a material of similar composition. Therefore, an ALD process that reduces the overall fabrication throughput may be less attractive than the comparable CVD process. By utilizing a batch tool, productivity may be improved without sacrificing the benefits provided by ALD processes.

A batch deposition process may be used to maintain or increase throughput during a fabrication process by simultaneously processing multiple substrates within a single chamber. However, batch processes using CVD techniques remain limited due to the smaller geometries of modern devices. Current batch deposition processes utilizing ALD techniques may have an incubation delay prior to the onset of a constant deposition rate. The incubation delay may be attributed to a homogenous terminated surface of functional groups, such as hydrides, hydroxides, silicides and the like. Also, current ALD batch deposition processes may form high levels of particulates and other contaminants that end-up on the substrate surface. Contaminated surfaces may further increase incubation delay, as well as cause defects within the deposited material that lead to poor device performance.

Therefore, there is a need for a deposition process to decrease the incubation delay and reduce contaminants on a substrate surface prior to depositing a material, preferably, a hafnium oxide material during an ALD batch process.

SUMMARY OF THE INVENTION

In one embodiment of the invention, a method for forming a material on a substrate is provided which includes exposing a plurality of substrates within a batch process chamber to a pretreatment process and exposing the substrates sequentially to a hafnium precursor gas and a second precursor gas to form a hafnium-containing layer during an ALD cycle. The ALD cycle may be repeated until the hafnium-containing layer is deposited to a predetermined thickness on the substrates.

In another embodiment of the invention, a method for forming a hafnium material on a substrate is provided which includes exposing a plurality of substrates within a batch process chamber to a first oxidizing gas during a pretreatment process, exposing the substrates sequentially to a second oxidizing gas and a process gas containing a hafnium precursor during an ALD cycle and repeating the ALD cycle to form a hafnium-containing material. In one example, the first and second oxidizing gases are the same oxidizing gases. In a preferred example, the first and second oxidizing gases are different oxidizing gases. In an alternative example, the process gas may further contain a silicon precursor or an aluminum precursor, either pre-mixed or co-flowed into the process chamber.

The deposited hafnium-containing layer generally contains hafnium oxide, but may also contain hafnium silicate, hafnium aluminate, hafnium silicon aluminate or the like. In one example, the process gas containing a hafnium precursor and may contain an additional precursor, such as a silicon precursor or an aluminum precursor. In another example, an additional ALD cycle for forming a silicon oxide material and/or an aluminum oxide material may be sequentially altered with an ALD cycle for forming the hafnium oxide.

The pretreatment processes and the ALD processes described herein may be conducted within a single substrate process chamber. Preferably, the pretreatment processes and the ALD processes are conducted within a batch process chamber containing a plurality of substrates, such as 25 substrates, 50 substrates or 100 substrates. The pretreatment process may last for a time period within a range from about 1 second to about 60 minutes. In one example, the pretreatment process may last for a time period within a range from about 1 second to about 10 minutes. In another example, the pretreatment process may last for a time period within a range from about 10 minutes to about 60 minutes.

The first oxidizing gas and the second oxidizing gas may independently contain an oxygen source, such as oxygen, ozone, atomic-oxygen, water, hydrogen peroxide, nitrous oxide, nitric oxide, derivatives thereof or combinations thereof. In one example, the first oxidizing gas contains ozone and the second oxidizing gas contains water. In another example, the first oxidizing gas contains water and the second oxidizing gas contains ozone. In one example, the oxidizing gas contains an ozone/oxygen ($O_3/O_2$) mixture, such that the ozone is at a concentration within a range from about 1 atomic percent (at %) to about 50 at %, preferably, from about 5 at % to about 30 at %, and more preferably, from about 10 at % to about 20 at %. In another example, the oxidizing gas contains water vapor formed from an oxygen source and a hydrogen source produced by a catalytic water vapor generator.

In another embodiment of the invention, a method for forming a hafnium material on a substrate is provided which includes exposing a plurality of substrates within a batch process chamber to a first oxidizing gas for a predetermined during a pretreatment process time and subsequently conducting an ALD process to form a hafnium-containing layer. During the ALD process, an ALD cycle is repeated to expose the substrates to a hafnium precursor for a time period of at least 30 seconds, expose the batch process chamber to a first purge process, expose the substrates to a second oxidizing gas for a time period of at least 30 seconds and expose the batch process chamber to a second purge process. In one example, the substrates are exposed to the hafnium precursor for a time period within a range from about 30 seconds to about 90 seconds and to the second oxidizing gas for a time period within a range from about 30 seconds to about 90 seconds.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawing. It is to be noted, however, that the appended drawing illustrates only typical embodiments of the invention and is therefore not to be considered limiting of its scope, for the invention may admit to other equally effective embodiments.

DETAILED DESCRIPTION

Figure 1:
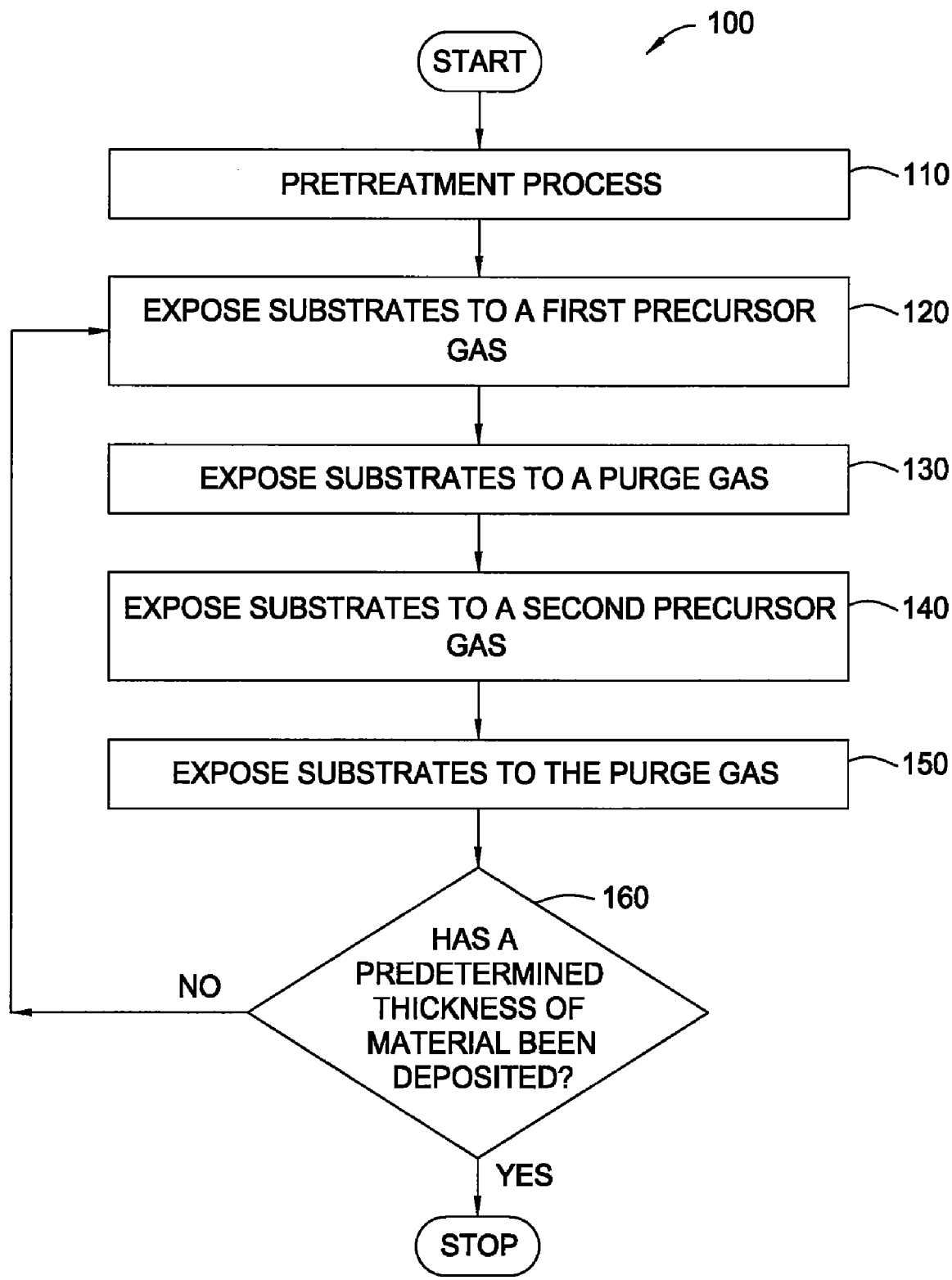
FIG. 1 illustrates a process sequence according to an embodiment described herein.

Embodiments of the invention provide methods for preparing materials used in a variety of applications, especially for high-k dielectric materials and barrier materials used in transistor and capacitor fabrication. The methods include pretreatment processes for substrates prior to conducting a chemical vapor deposition process, such as an atomic layer deposition (ALD) process or a chemical vapor deposition (CVD) process. In a preferred embodiment, an ALD process may be used to control elemental composition of the deposited materials. The pretreatment process and the vapor deposition process may be conducted within a single substrate process chamber, but preferably, the processes are conducted within a batch process chamber containing a plurality of substrates (e.g., 25, 50, 100 or more).

In FIG. 1, a flow chart depicts process 100 as described in one embodiment herein. Process 100 provides exposing substrates to a pretreatment process (step 110), to a first precursor (step 120), to a purge gas (step 130), to a second precursor (step 140) and again to the purge gas (step 150). An ALD cycle (steps 120, 130, 140 and 150) may be repeated to form the deposited material with a predetermined thickness (step 160). In one example, a pretreatment process contains a first oxidizing gas, the first precursor is a hafnium precursor and the second precursor is a second oxidizing gas.

The substrates may be exposed to one or multiple pretreatment processes during step 110. The pretreatment process may be conducted in a mini-batch process chamber maintained at a pressure within a range from about 1 mTorr to about 100 Torr, preferably, from about 10 mTorr to about 50 Torr, and more preferably, from about 5 Torr to about 10 Torr, such as about 8 Torr. The substrates are heated to a temperature within a range from about 70° C. to about 800° C., preferably, from about 100° C. to about 500° C., and more preferably, from about 200° C. to about 400° C.

The pretreatment process may expose the substrate surface to a treatment gas for a time period within a range from about 1 second to about 90 minutes, preferably from about 30 seconds to about 60 minutes, and more preferably from about 1 minute to about 40 minutes. In one example, the pretreatment process lasts for a time period within a range from about 1 second to about 60 seconds. In another example, the pretreatment process lasts for a time period within a range from about 1 minute to about 20 minutes. In another example, the pretreatment process lasts for a time period within a range from about 20 minutes to about 40 minutes. A pretreatment gas may be introduced into the process chamber during the pretreatment process at a rate within a range from about 100 standard cubic centimeters per minute (sccm) to about 5 standard liters per minute (slm), preferably, from about 500 sccm to about 4 slm, and more preferably, from about 1 slm to about 3 slm. The pretreatment gas forms a functional group that generally provides a base for an incoming chemical precursor to attach on the substrate surface. The substrates may be terminated with a variety of functional groups after being exposed to the pretreatment process. Functional groups that may be formed include hydroxyls (OH), alkoxy (OR, where R=Me, Et, Pr or Bu), oxygen radicals and aminos (NR or $NR_2$, where R=H, Me, Et, Pr or Bu), preferably, hydroxyls groups are formed on the substrate surface.

A pretreatment gas used during the pretreatment process preferably contains an oxidizing gas, but may contain an alternative reagent. Therefore, an oxidizing gas that may be used as a pretreatment gas includes oxygen ($O_2$), ozone ($O_3$), atomic-oxygen (O), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), derivatives thereof or combinations thereof. In another embodiment, the pretreatment gas may contain an alternative reagent that includes ammonia ($NH_3$), diborane ($B_2H_6$), silane ($SiH_4$), disilane ($Si_2H_6$), hydrogen ($H_2$), atomic-H, atomic-N, alcohols, amines, derivatives thereof or combination thereof. In an alternative embodiment, a pretreatment gas may contain a combination of an oxidizing gas and an alternative reagent. In a preferred example, an oxidizing gas is an ozone/oxygen ($O_3/O_2$) mixture, such that the ozone is at a concentration within a range form about 1 atomic percent (at %) to about 50 at %, preferably, from about 5 at % to about 30 at %, and more preferably, from about 10 at % to about 20 at %.

In one example of a pretreatment process, the substrates are exposed to an oxidizing gas containing water vapor generated from the water vapor generator (WVG) system containing a catalyst. The pretreatment process provides the substrate surface with hydroxyl terminated functional groups that react with precursors containing amino-type ligands (e.g., TDEAH, TDMAH, TDMAS, or Tris-DMAS) during a subsequent exposure (e.g., step 120). Pretreatment processes and deposition processes that utilize a WVG system and may be used herein are further described in commonly assigned and now abandoned U.S. Ser. No. 11/127,767, filed May 12, 2005, entitled, "Apparatuses and Methods for Atomic Layer Deposition of Hafnium-containing High-K Materials," and published as US 2005-0271813, which is incorporated herein by reference in its entirety. Additional pretreatment processes, pre-soak steps, and deposition processes that may be used herein are further described in commonly assigned U.S. Pat. No. 6,858,547, and in commonly assigned and now abandoned U.S. Ser. No. 10/302,752, filed Nov. 21, 2002, entitled, "Surface Pre-Treatment for Enhancement of Nucleation of High Dielectric Constant Materials," and published as US 2003-0232501, which are incorporated herein by reference in their entirety.

In one embodiment, the substrates are exposed to a first oxidizing gas during the pretreatment process and to a second oxidizing gas during the deposition process, such that the first and the second oxidizing gases may be the same or different oxidizing gases. In a preferred example, the pretreatment process and the deposition process utilizes different oxidizing gases. Therefore, the first oxidizing gas may provide a preferred functionalized pretreated substrate surface while the second oxidizing gas may be a preferred oxidant during the subsequent vapor deposition process. In one example, the first oxidizing gas contains ozone and the second oxidizing gas contains water. In another example, the first oxidizing gas contains water and the second oxidizing gas contains ozone.

After the substrates have been exposed to a pretreatment process, a material may be deposited during a vapor deposition process, such as an ALD process or a CVD process and may include a plasma-enhanced ALD (PE-ALD) process, a plasma-enhanced CVD (PE-CVD) process, a pulsed CVD process or combinations thereof. In one example, the substrates are sequentially exposed to a metal precursor and an oxidizing gas to form a metal oxide material during an ALD process. In another example, the substrates are sequentially exposed to a metal precursor, an oxidizing gas, a silicon precursor and the oxidizing gas to form a metal silicate material during an ALD process. In another example, the substrates are sequentially exposed to a precursor mixture and an oxidizing gas during an ALD process to form materials containing at least three elements, such as a metal silicate material or a metal aluminate material. Examples of a precursor mixture include a combined mixture of a hafnium precursor and a silicon precursor or a hafnium precursor and an aluminum precursor.

The material deposited during the deposition step may be a dielectric material, a barrier material, a conductive material, a nucleation/seed material or an adhesion material. In one embodiment, the deposited material may be a dielectric material containing oxygen and/or nitrogen and at least one additional element, such as hafnium, silicon, tantalum, titanium, aluminum, zirconium, lanthanum or combinations thereof. For example, the dielectric material may contain hafnium oxide, zirconium oxide, tantalum oxide, aluminum oxide, lanthanum oxide, titanium oxide, silicon oxide, silicon nitride, oxynitrides thereof (e.g., $HfO_xN_y$), silicates thereof (e.g., $HfSi_xO_y$), aluminates thereof (e.g., $HfAl_xO_y$), silicon oxynitrides thereof (e.g., $HfSi_xO_yN_z$), derivatives thereof or combinations thereof. The dielectric material may also contain multiple layers of varying compositions. For example, a laminate film may be formed by depositing a silicon oxide layer onto a hafnium oxide layer to form a hafnium silicate material. A third layer of aluminum oxide may be deposited on the hafnium silicate to further provide a hafnium aluminum silicate material.

In one example of process 100, an ALD process is used to form a hafnium-containing material. The ALD process may be conducted in a mini-batch process chamber maintained at a pressure within a range from about 1 mTorr to about 100 Torr, preferably, from about 10 mTorr to about 10 Torr, and more preferably, from about 5 Torr to about 10 Torr, such as about 8 Torr. The substrates may be heated to a temperature within a range from about 70° C. to about 800° C., preferably, from about 100° C. to about 500° C., and more preferably, from about 200° C. to about 400° C.

A first precursor (e.g., hafnium precursor) may be introduced into the process chamber at a rate within a range from about 100 sccm to about 5 slm, preferably, from about 100 sccm to about 4 slm, and more preferably, from about 100 sccm to about 3 slm (step 120). A carrier gas may be provided with the first precursor and include nitrogen, argon, helium, hydrogen or combinations thereof. The first precursor may be introduced into the process chamber for a time period within a range from about 1 second to about 5 minutes, preferably, from about 5 seconds to about 2 minutes, and more preferably, from about 10 seconds to about 90 seconds. In one example, the first precursor is a hafnium precursor, such as a hafnium halide (e.g., $HfCl_4$) or a hafnium amino compound. Hafnium amino compounds are preferably tetrakis(dialkylamino)hafnium compounds that include tetrakis(diethylamino)hafnium (($Et_2N)_4Hf$ or TDEAH), tetrakis(dimethylamino)hafnium (($Me_2N)_4Hf$ or TDMAH) or tetrakis(ethylmethylamino)hafnium (($EtMeN)_4Hf$ or TEMAH).

A second precursor (e.g., an oxidizing gas) may be introduced into the process chamber at a rate within a range from about 100 sccm to about 5 slm, preferably, from about 500 sccm to about 4 slm, and more preferably, from about 1 slm to about 3 slm (step 140). The second precursor may be provided with a carrier gas and introduced into the process chamber for a time period within a range from about 1 second to about 5 minutes, preferably, from about 1 second to about 2 minutes, and more preferably, from about 1 second to about 90 seconds. In one example, the second precursor is an oxidizing gas, such as oxygen ($O_2$), ozone ($O_3$), atomic-oxygen (O), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), derivatives thereof or combinations thereof. In a preferred example, an oxidizing gas contains an ozone/oxygen ($O_3/O_2$) mixture, such that the ozone is at a concentration within a range form about 1 atomic percent (at %) to about 50 at %, preferably, from about 5 at % to about 30 at %, and more preferably, from about 10 at % to about 20 at %.

A purge gas (e.g., argon or nitrogen) is typically introduced into the process chamber at a rate within a range from about 100 sccm to about 5 slm, preferably, from about 500 sccm to about 4 slm, and more preferably, from about 1 slm to about 3 slm (steps 130 and 150). The purge gas helps remove any excess chemical precursors, by-products and contaminants from the substrates and the process chamber. The purge gas may be introduced for a time period within a range from about 1 second to about 5 minutes, preferably, from about 1 second to about 2 minutes, and more preferably, from about 1 second to about 90 seconds. Suitable carrier gases or purge gases may include argon, nitrogen, helium, hydrogen, forming gas or combinations thereof.

In one embodiment, an evacuation step may be conducted after the pretreatment step (step 110) and after each ALD step (steps 120, 130, 140 and 150). The process chamber is at least partially evacuated during the evacuation step, if not substantially or completely evacuated of gases. The evacuation step may last for a time period within a range from about 1 second to about 5 minutes, preferably, from about 1 second to about 2 minutes, and more preferably, from about 1 second to about 60 seconds. The process chamber may be evacuated to have a pressure within a range from about 100 mTorr to about 5 Torr, such as about 200 mTorr.

Each ALD cycle (steps 120 through 160) forms a layer of a material (e.g., hafnium oxide) on the substrates. Usually, each deposition cycle forms a layer having a thickness within a range from about 0.1 Å to about 10 Å. Depending on specific device requirements, subsequent deposition cycles may be needed to deposit the material having a desired thickness (step 160). As such, a deposition cycle (steps 120 through 160) may be repeated to achieve the predetermined thickness of the material.

In one example, a hafnium oxide material is deposited onto the substrates within a batch ALD process chamber. The substrates are exposed to a pretreatment process containing an oxidizing gas (e.g., $O_3$ or $H_2O$) introduced into the process chamber for a time period within a range from about 1 second to about 40 minutes (step 110). During an ALD cycle, the substrates are exposed to a first precursor (e.g., hafnium precursor) introduced into the process chamber alone or in combination with a carrier gas for a time period within a range from about 10 seconds to about 90 seconds (step 120). Next, a purge gas is introduced into the process chamber for a time period within a range from about 10 seconds to about 60 seconds (step 130) to purge or otherwise remove any residual precursor or by-products. Subsequently, the substrate is exposed to a second precursor (e.g., $O_3$ or $H_2O$) introduced into the process chamber alone or in combination with a carrier gas for a time period within a range from about 10 seconds to about 90 seconds (step 140). Thereafter, the purge gas is again administered into the process chamber for a time period within a range from about 10 seconds to about 60 seconds (step 150).

In one embodiment, hydrogen gas or a forming gas may be used as a carrier gas, purge and/or a reactant gas to reduce halogen contamination from the deposited materials. Precursors that contain halogen atoms (e.g., $HfCl_4$, $SiCl_4$ or $Si_2Cl_6$) readily contaminate the deposited materials. Hydrogen is a reductant and produces hydrogen halides (e.g., HCl) as a volatile and removable by-product. Therefore, hydrogen may be used as a carrier gas or a reactant gas when combined with a precursor compound (e.g., hafnium, silicon, oxygen precursors) and may include another carrier gas (e.g., Ar or $N_2$).

Exemplary hafnium precursors useful for depositing hafnium-containing materials may contain ligands such as halides, alkylaminos, cyclopentadienyls, alkyls, alkoxides, derivatives thereof or combinations thereof. Hafnium halide compounds useful as hafnium precursors may include $HfCl_4$, $HfI_4$, and $HfBr_4$. Hafnium alkylamino compounds useful as hafnium precursors include $(RR'N)_4Hf$, where R or R' are independently hydrogen, methyl, ethyl, propyl or butyl. Hafnium precursors useful for depositing hafnium-containing materials as described herein include $(Et_2N)_4Hf$ (TDEAH), $(Me_2)_4Hf$ (TDMAH), $(EtMeN)_4Hf$ (TEMAH), $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4Hf$, $(hfac)_4Hf$, $(tfac)_4Hf$, $(thd)_4Hf$, $(NO_3)_4Hf$, $(^tBuO)_4Hf$, $(^iPrO)_4Hf$, $(EtO)_4Hf$, $(MeO)_4Hf$ or derivatives thereof. Preferably, hafnium precursors used during the deposition process herein include $HfCl_4$, TDEAH, TDMAH and TEMAH.

Exemplary silicon precursors useful for depositing silicon-containing materials (e.g., silicates) include silanes, alkylaminosilanes, silanols or alkoxy silanes. Silicon precursors may include $(Me_2N)_4Si$, $(Me_2N)_3SiH$, $(Me_2N)_2SiH_2$, $(Me_2N)SiH_3$, $(Et_2N)_4Si$, $(Et_2N)_3SiH$, $(MeEtN)_4Si$, $(MeEtN)_3SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSi(OH)_3$, $Me_2Si(OH)_2$, $(MeO)_4Si$, $(EtO)_4Si$ or derivatives thereof. Other alkylaminosilane compounds useful as silicon precursors include $(RR'N)_{4-n}SiH_n$, where R or R' are independently hydrogen, methyl, ethyl, propyl or butyl and n=0-3. Other alkoxy silanes may be described by the generic chemical formula $(RO)_{4-n}SiL_n$, where R=methyl, ethyl, propyl or butyl and L=H, OH, F, Cl, Br or I and mixtures thereof. Preferably, silicon precursors used during deposition processes herein include $(Me_2N)_3SiH$, $(Et_2N)_3SiH$, $(Me_2N)_4Si$, $(Et_2N)_4Si$ or $SiH_4$. Exemplary nitrogen precursors may include ammonia ($NH_3$), nitrogen ($N_2$), hydrazines (e.g., $N_2H_4$ or $MeN_2H_3$), amines (e.g., $Me_3N$, $Me_2NH$ or $MeNH_2$), anilines (e.g., $C_6H_5NH_2$), organic azides (e.g., $MeN_3$ or $Me_3SiN_3$), inorganic azides (e.g., $NaN_3$ or $CP_2CoN_3$), radical nitrogen compounds (e.g., $N_3$, $N_2$, N, NH or $NH_2$), derivatives thereof or combinations thereof. Radical nitrogen compounds may be produced by heat, hot-wires or plasma.

The materials formed by the deposition processes described herein may have a thickness within a range from about 5 Å to about 300 Å, preferably from, about 10 Å to about 200 Å, and more preferably from, about 20 Å to about 100 Å. In some examples, hafnium oxide may be deposited having a thickness within a range from about 10 Å to about 60 Å, preferably, from about 30 Å to about 40 Å. Throughout the examples, a hafnium oxide material is formed with an empirical chemical formula of $HfO_x$, where x is 2 or less. Hafnium oxide may have the molecular chemical formula of $HfO_2$, but by varying process conditions (e.g., timing, temperature or precursors), hafnium oxides may be formed with less oxidized hafnium, such as $HfO_{1.8}$.

Batch process chambers for conducting vapor deposition processes, such as atomic layer deposition (ALD) or conventional chemical vapor deposition (CVD), that may be used during embodiments described herein are available from Applied Materials, Inc., located in Santa Clara, Calif., and are further disclosed in commonly assigned U.S. Pat. Nos. 6,352,593 and 6,321,680, in commonly assigned U.S. Ser. No. 10/342,151, filed Jan. 13, 2003, and now issued as U.S. Pat. No. 7,393,561, and in commonly assigned and now abandoned U.S. Ser. No. 10/216,079, filed Aug. 9, 2002, entitled, "High Rate Deposition at Low Pressure in a Small Batch Reactor," and published as US 2003-0049372, which are incorporated herein by reference in their entirety for the purpose of describing apparatuses used during deposition processes. Single wafer ALD chambers that may be used by embodiments described herein are further disclosed in commonly assigned U.S. Pat. No. 6,916,398, and in commonly assigned U.S. Ser. No. 11/127,753, filed May 12, 2005, entitled, "Apparatuses and Methods for Atomic Layer Deposition of Hafnium-containing High-K Materials," and published as US 2005-0271812, which are both incorporated herein by reference in their entirety.

A "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Processes of the embodiments described herein may deposit hafnium-containing materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a post-treatment process to polish, etch, reduce, oxidize, hydroxylate, anneal and/or bake the substrate surface.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a process chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B and a third precursor containing compound C are each separately pulsed into the process chamber. Alternatively, a pulse of a first precursor may overlap in time with a pulse of a second precursor while a pulse of a third precursor does not overlap in time with either pulse of the first and second precursors.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein is intended to refer to a pulse of precursor step followed by a purge step.

EXAMPLES

The hypothetical examples 1-4 may be conducted within an ALD batch process chamber, available from Applied Materials, Inc., located in Santa Clara, Calif., and mini-batch process chambers, as described in commonly assigned U.S. Pat. Nos. 6,352,593 and 6,321,680, in commonly assigned U.S. Ser. No. 10/342,151, filed Jan. 13, 2003, and issued as U.S. Pat. No. 7,393,561, and in commonly assigned and now abandoned U.S. Ser. No. 10/216,079, filed Aug. 9, 2002, entitled, "High Rate Deposition at Low Pressure in a Small Batch Reactor," and published as US 2003-0049372, which are incorporated herein by reference in their entirety for the purpose of describing apparatuses to conduct the deposition processes.

Example 1

$HfO_2$ ($H_2O$-Soak/$O_3$-ALD)

A batch of 50 substrates is positioned on the susceptors of a boat within the mini-batch ALD chamber. The process chamber is maintained at a pressure of about 8 Torr at about 250° C. and exposed to a pretreatment gas containing water vapor for about 20 minutes. Thereafter, a hafnium oxide layer is formed during an ALD process by sequentially exposing the substrates to a hafnium precursor (TDMAH in nitrogen carrier gas) and ozone (15 at % ozone in oxygen). The substrates are heated to about 250° C. and exposed to a plurality of ALD cycles. Each ALD cycle includes flowing TDMAH into the chamber for about 30 seconds, evacuating the chamber for about 30 seconds, flowing nitrogen (purge gas) into the chamber for about 30 seconds, evacuating the chamber for about 30 seconds, flowing ozone into the chamber for about 30 seconds, evacuating the chamber for about 30 seconds, flowing nitrogen into the chamber for about 30 seconds and evacuating the chamber for about 30 seconds. The ALD cycle is repeated a total of 50 cycles to form a hafnium oxide layer with a thickness of about 80 Å.

Example 2

$HfO_2$ ($O_3$-Soak/$H_2O$-ALD)

A batch of 50 substrates is positioned on the susceptors of a boat within the mini-batch ALD chamber. The process chamber is maintained at a pressure of about 6 Torr at about 200° C. and exposed to a pretreatment gas containing ozone (15 at % ozone in oxygen) for about 5 minutes. Thereafter, a hafnium oxide layer is formed during an ALD process by sequentially exposing the substrates to a hafnium precursor (TDMAH in nitrogen carrier gas) and water vapor (in nitrogen carrier gas). The substrates are heated to about 200° C. and exposed to a plurality of ALD cycles. Each ALD cycle includes flowing TDMAH into the chamber for about 30 seconds, evacuating the chamber for about 30 seconds, flowing nitrogen (purge gas) into the chamber for about 30 seconds, evacuating the chamber for about 30 seconds, flowing water vapor into the chamber for about 30 seconds, evacuating the chamber for about 30 seconds, flowing nitrogen into the chamber for about 30 seconds and evacuating the chamber for about 30 seconds. The ALD cycle is repeated a total of 50 cycles to form a hafnium oxide layer with a thickness of about 80 Å.

Example 3

$HfSiO_4$ ($O_3$-Soak/$H_2O$-ALD)

A batch of 50 substrates is positioned on the susceptors of a boat within the mini-batch ALD chamber. The process chamber is maintained at a pressure of about 8 Torr at about 300° C. and exposed to a pretreatment gas containing ozone (15 at % ozone in oxygen) for about 10 minutes. Thereafter, a hafnium silicate layer is formed during an ALD process by sequentially exposing the substrates to a hafnium precursor (TDMAH in nitrogen carrier gas), water vapor, a silicon precursor (Tris-DMAS in nitrogen carrier gas) and water vapor. The substrates are heated to about 300° C. and exposed to a plurality of ALD cycles. Each ALD cycle includes flowing TDMAH into the chamber for about 30 seconds, evacuating the chamber for about 30 seconds, flowing nitrogen (purge gas) into the chamber for about 30 seconds, evacuating the chamber for about 30 seconds, flowing water vapor into the chamber for about 30 seconds, evacuating the chamber for about 30 seconds, flowing nitrogen into the chamber for about 30 seconds and evacuating the chamber for about 30 seconds, flowing Tris-DMAS into the chamber for about 30 seconds, evacuating the chamber for about 30 seconds, flowing nitrogen into the chamber for about 30 seconds, evacuating the chamber for about 30 seconds, flowing water vapor into the chamber for about 30 seconds, evacuating the chamber for about 30 seconds, flowing nitrogen into the chamber for about 30 seconds and evacuating the chamber for about 30 seconds. The ALD cycle is repeated a total of 50 cycles to form a hafnium silicate layer with a thickness of about 120 Å.

Example 4

HfSiO$_4$ (Co-Flow) (O$_3$-Soak/H$_2$O-ALD)

A batch of 50 substrates is positioned on the susceptors of a boat within the mini-batch ALD chamber. The process chamber is maintained at a pressure of about 8 Torr at about 300° C. and exposed to a pretreatment gas containing ozone (15 at % ozone in oxygen) for about 10 minutes. Thereafter, a hafnium silicate layer is formed during an ALD process by sequentially exposing the substrates to a hafnium/silicon precursor mixture (TDMAH/Tris-DMAS (1:1) in nitrogen carrier gas) and water vapor. The substrates are heated to about 300° C. and exposed to a plurality of ALD cycles. Each ALD cycle includes flowing the TDMAH/Tris-DMAS mixture into the chamber for about 30 seconds, evacuating the chamber for about 30 seconds, flowing nitrogen into the chamber for about 30 seconds, evacuating the chamber for about 30 seconds, flowing water into the chamber for about 30 seconds, evacuating the chamber for about 30 seconds, flowing nitrogen into the chamber for about 30 seconds and evacuating the chamber for about 30 seconds. The ALD cycle is repeated a total of 80 cycles to form a hafnium silicate layer with a thickness of about 100 Å.

While the foregoing is directed to embodiments of the present invention, other and further embodiments of the invention may be devised without departing from the basic scope thereof, and the scope thereof is determined by the claims that follow.

The invention claimed is:

1. A method for forming a hafnium material on a substrate within a processing chamber, comprising:
exposing a substrate within a processing chamber to a first oxidizing gas during a pretreatment process, wherein the first oxidizing gas comprises an O$_3$/O$_2$ mixture having an ozone concentration within a range from about 5 atomic percent to about 30 atomic percent;
exposing the substrate sequentially to a second oxidizing gas and a deposition gas during an atomic layer deposition cycle, wherein the second oxidizing gas comprises water and the deposition gas comprises a hafnium amino compound; and
repeating the atomic layer deposition cycle to form a hafnium-containing layer having a thickness within a range from about 5 Å to about 300 Å.

2. The method of claim 1, wherein the hafnium-containing layer comprises hafnium oxide having the chemical formula of HfO$_x$, whereas x is about 1.8.

3. The method of claim 1, wherein the deposition gas further comprises a silicon precursor.

4. The method of claim 3, wherein the hafnium-containing layer comprises hafnium silicate.

5. The method of claim 3, wherein the silicon precursor comprises silane, disilane, or derivatives thereof.

6. The method of claim 3, wherein the silicon precursor comprises an alkylamino silane.

7. The method of claim 6, wherein the alkylamino silane is selected from the group consisting of tetrakis(dimethylamino) silane, tetrakis(diethylamino) silane, tris(dimethylamino) silane, tris(diethylamino) silane, and derivatives thereof.

8. The method of claim 1, wherein the hafnium amino compound is tetrakis(diethylamino) hafnium, tetrakis(dimethylamino) hafnium, or tetrakis(ethylmethylamino) hafnium.

9. The method of claim 8, wherein the ozone concentration is within a range from about 10 atomic percent to about 20 atomic percent.

10. The method of claim 8, wherein the thickness of the hafnium-containing layer is within a range from about 20 Å to about 100 Å.

11. A method for forming a hafnium material on a substrate within a processing chamber, comprising:
exposing a substrate within a processing chamber to a first oxidizing gas during a pretreatment process, wherein the first oxidizing gas comprises an O$_3$/O$_2$ mixture having an ozone concentration within a range from about 1 atomic percent to about 50 atomic percent;
conducting an atomic layer deposition cycle, comprising:
exposing the substrate to a hafnium precursor gas comprising a hafnium amino compound for a time period of at least about 30 seconds;
purging the processing chamber;
exposing the substrate to a second oxidizing gas comprising water for a time period of at least about 30 seconds; and
purging the processing chamber; and
repeating the atomic layer deposition cycle to form a hafnium-containing layer.

12. The method of claim 11, wherein the ozone concentration is within a range from about 5 atomic percent to about 30 atomic percent.

13. The method of claim 12, wherein the ozone concentration is within a range from about 10 atomic percent to about 20 atomic percent.

14. The method of claim 11, wherein the hafnium-containing layer is deposited having a thickness within a range from about 5 Å to about 300 Å.

15. The method of claim 14, wherein the thickness is within a range from about 20 Å to about 100 Å.

16. The method of claim 11, wherein the substrate is exposed to the hafnium precursor gas for a time period within a range from about 30 seconds to about 90 seconds.

17. The method of claim 11, wherein the substrate is exposed to the second oxidizing gas for a time period within a range from about 30 seconds to about 90 seconds.

18. The method of claim 11, wherein the atomic layer deposition cycle further comprises sequentially exposing the substrate to a silicon precursor and the second oxidizing gas, and the hafnium-containing layer comprises hafnium silicate.

19. The method of claim 11, wherein the hafnium amino compound is tetrakis(diethylamino) hafnium, tetrakis(dimethylamino) hafnium, or tetrakis(ethylmethylamino) hafnium.

20. A method for forming a hafnium material on a substrate within a processing chamber, comprising:
exposing a substrate to water within a processing chamber during a pretreatment process;

exposing the substrate sequentially to a hafnium precursor gas and an oxidizing precursor gas during an atomic layer deposition cycle, wherein the hafnium precursor gas comprises a hafnium amino compound, the oxidizing precursor gas comprises an $O_3/O_2$ mixture having an ozone concentration within a range from about 1 atomic percent to about 50 atomic percent, and the substrate is heated to a temperature within a range from about 200° C. to about 400° C. during the atomic layer deposition cycle; and repeating the atomic layer deposition cycle to form a hafnium-containing layer.

21. The method of claim 20, wherein the pretreatment process occurs for a time period within a range from about 1 second to about 5 minutes.

22. The method of claim 20, wherein the hafnium-containing layer is deposited having a thickness within a range from about 5 Å to about 300 Å.

23. The method of claim 22, wherein the thickness is within a range from about 20 Å to about 100 Å.

24. The method of claim 20, wherein the ozone concentration is within a range from about 5 atomic percent to about 30 atomic percent.

25. The method of claim 24, wherein the ozone concentration is within a range from about 10 atomic percent to about 20 atomic percent.

* * * * *

UNITED STATES PATENT AND TRADEMARK OFFICE
CERTIFICATE OF CORRECTION

| | |
|---|---|
| PATENT NO. | : 7,972,978 B2 |
| APPLICATION NO. | : 12/163876 |
| DATED | : July 5, 2011 |
| INVENTOR(S) | : Mahajani |

It is certified that error appears in the above-identified patent and that said Letters Patent is hereby corrected as shown below:

In the References Cited (56):

Please delete "6,291,876 B1 9/2001 Stumborg et al." and insert --6,291,867 B1 9/2001 Wallace et al.-- therefor;

Please delete "6,647,138 B1 11/2003 Sakaguchi" and insert --6,674,138 B1 1/2004 Halliyal et al.-- therefor.

Signed and Sealed this
Twenty-seventh Day of September, 2011

David J. Kappos
*Director of the United States Patent and Trademark Office*